United States Patent
Han et al.

(10) Patent No.: US 11,456,493 B2
(45) Date of Patent: Sep. 27, 2022

(54) METHOD FOR PRECISELY ANALYZING DEGREE OF IMPREGNATION OF ELECTROLYTE OF ELECTRODE IN CELL

(71) Applicant: LG CHEM, LTD., Seoul (KR)

(72) Inventors: Song Yi Han, Daejeon (KR); Young Deok Kim, Daejeon (KR); Dae Soo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 310 days.

(21) Appl. No.: 16/771,146

(22) PCT Filed: Aug. 6, 2019

(86) PCT No.: PCT/KR2019/009808
§ 371 (c)(1),
(2) Date: Jun. 9, 2020

(87) PCT Pub. No.: WO2020/032545
PCT Pub. Date: Feb. 13, 2020

(65) Prior Publication Data
US 2021/0167432 A1 Jun. 3, 2021

(30) Foreign Application Priority Data
Aug. 9, 2018 (KR) ........................ 10-2018-0092997

(51) Int. Cl.
*H01M 10/0567* (2010.01)
*H01M 10/44* (2006.01)
(Continued)

(52) U.S. Cl.
CPC ...... *H01M 10/446* (2013.01); *G01R 31/3648* (2013.01); *G01R 31/385* (2019.01);
(Continued)

(58) Field of Classification Search
CPC ............. G01R 31/3648; G01R 31/385; H01M 10/0525; H01M 10/0564; H01M 10/0567;
(Continued)

(56) References Cited

FOREIGN PATENT DOCUMENTS

| JP | 2012-181976 A | 9/2012 |
|----|----|----|
| JP | 2018-041529 A | 3/2018 |

(Continued)

OTHER PUBLICATIONS

Machine Translation KR100865401B1 (Year: 2008).*
(Continued)

*Primary Examiner* — Victoria H Lynch
(74) *Attorney, Agent, or Firm* — Morgan, Lewis & Bockius LLP

(57) ABSTRACT

The present invention relates to a method for analyzing a degree of impregnation of an electrolyte of an electrode in a battery cell, the method comprising: a battery cell manufacturing step (S1) of preparing a battery cell by injecting an electrolyte into a battery cell including an electrode to be evaluated; a step of charging/discharging the battery cell several times and obtaining a capacity-voltage profile for each cycle (S2); a step of obtaining a differential capacity (dV/dQ) curve obtained by differentiating the capacitance-voltage profile for each cycle with respect to the capacity (S3); and a step of, in the differential capacity curve, determining a cycle at which behavior becomes the same as a time point when impregnation is sufficiently performed (S4).

10 Claims, 5 Drawing Sheets

(51) Int. Cl.
  *G01R 31/385* (2019.01)
  *H01M 50/609* (2021.01)
  *G01R 31/36* (2020.01)
  *H01M 4/133* (2010.01)
  *H01M 4/505* (2010.01)
  *H01M 4/525* (2010.01)
  *H01M 4/62* (2006.01)
  *H01M 10/0569* (2010.01)
  *H01M 10/0525* (2010.01)
  *H01M 4/02* (2006.01)

(52) U.S. Cl.
  CPC ........... *H01M 4/133* (2013.01); *H01M 4/505* (2013.01); *H01M 4/525* (2013.01); *H01M 4/623* (2013.01); *H01M 10/0567* (2013.01); *H01M 10/0569* (2013.01); *H01M 50/609* (2021.01); *H01M 10/0525* (2013.01); *H01M 2004/027* (2013.01); *H01M 2004/028* (2013.01)

(58) Field of Classification Search
  CPC ........... H01M 10/0569; H01M 10/446; H01M 2004/027; H01M 2004/028; H01M 4/133; H01M 4/505; H01M 4/525; H01M 4/623; H01M 50/60; H01M 50/609; Y02E 60/10
  See application file for complete search history.

(56) References Cited

FOREIGN PATENT DOCUMENTS

| | | |
|---|---|---|
| KP | 10-1769182 B1 | 8/2017 |
| KR | 10-0865401 B1 | 10/2008 |
| KR | 10-2014-0000997 A | 1/2014 |
| KR | 10-2017-0009767 A | 1/2017 |
| KR | 10-2017-0063414 A | 6/2017 |
| KR | 10-2017-0111772 A | 10/2017 |
| WO | 2018/056139 A1 | 3/2018 |

OTHER PUBLICATIONS

International Search Report (with partial translation) and Written Opinion issued in corresponding International Patent Application No. PCT/KR2019/009808, dated Nov. 19, 2019.
Korean Office Action dated Jun. 10, 2021 issued in corresponding Korean Patent Application No. 10-2019-0096322.

\* cited by examiner

[Fig. 1]
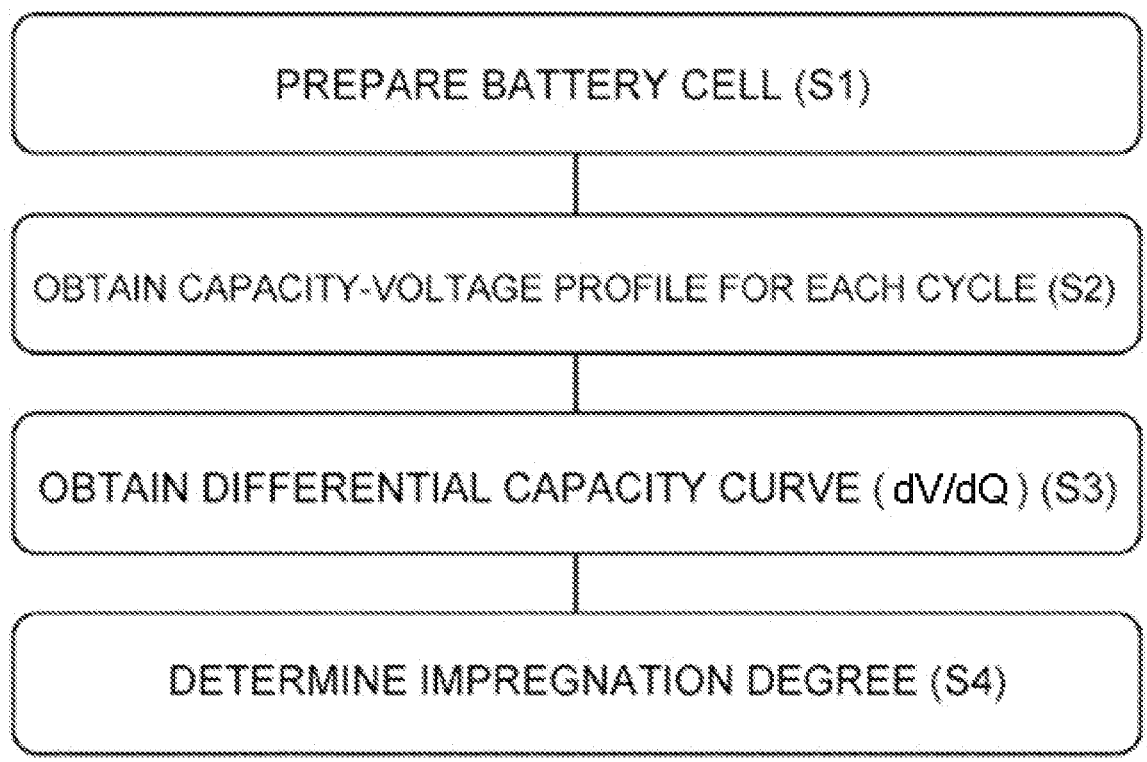

[Fig. 2]
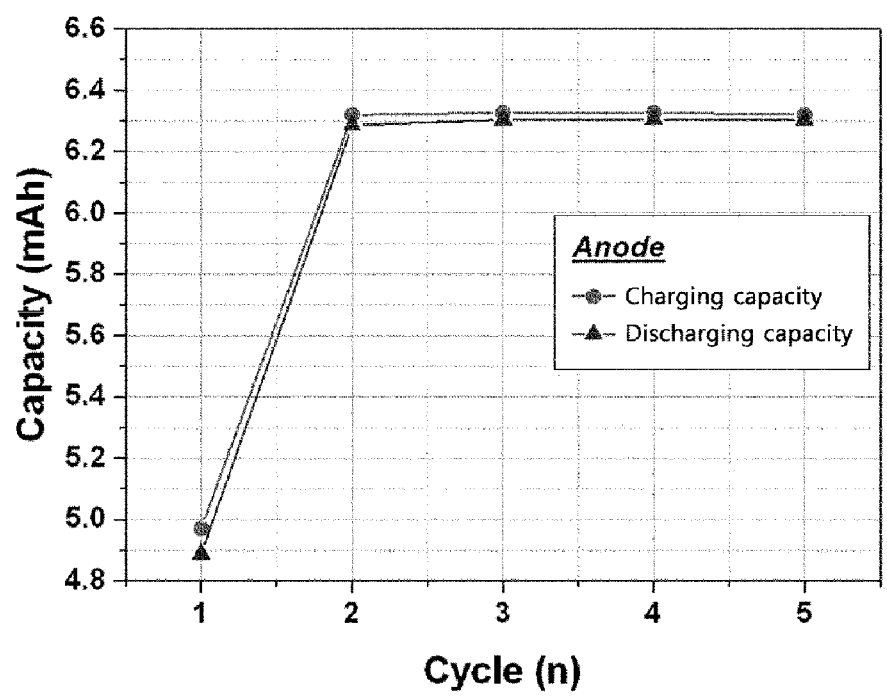

[Fig. 3]
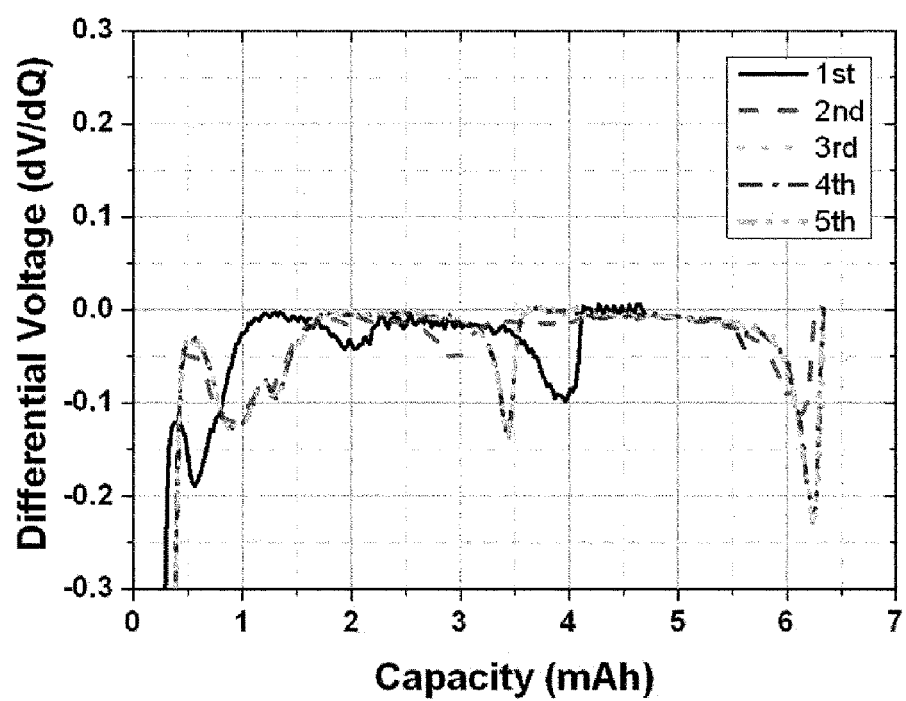

[Fig. 4]
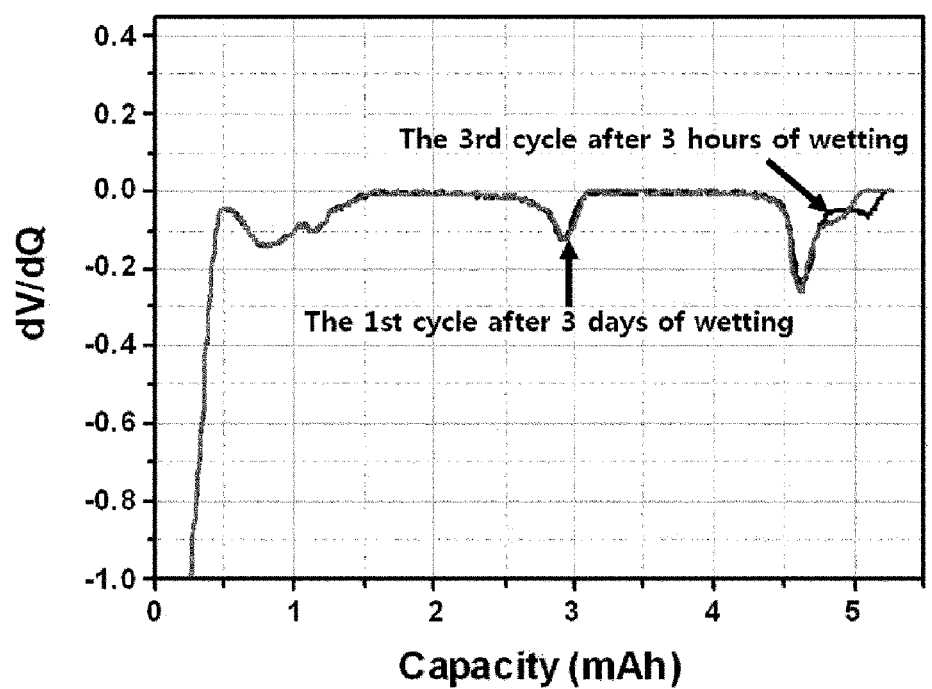

[Fig. 5]
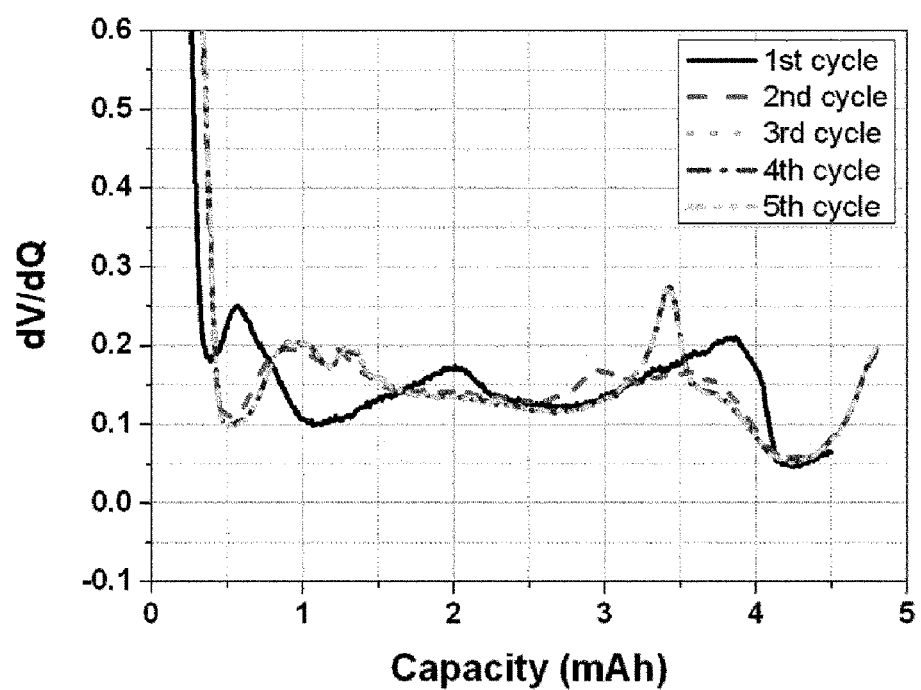

METHOD FOR PRECISELY ANALYZING DEGREE OF IMPREGNATION OF ELECTROLYTE OF ELECTRODE IN CELL

TECHNICAL FIELD

This application claims the benefit of priority based on Korean Patent Application No. 10-2018-0092997, filed on Aug. 9, 2018, and the entire contents of the Korean patent application are incorporated herein by reference.

The present invention relates to a method for precisely analyzing the degree of electrolyte impregnation of an electrode in a cell to determine at which cycle the electrolyte is sufficiently impregnated through a differential capacity curve which is obtained by differentiating a capacity-voltage profile with respect to the capacity for each charge/discharge cycle.

BACKGROUND ART

Recently, secondary batteries capable of charging and discharging have been widely used as energy sources of wireless mobile devices. In addition, the secondary battery has attracted attention as an energy source of an electric vehicle, a hybrid electric vehicle, etc., which are proposed as a solution for air pollution of existing gasoline vehicles and diesel vehicles using fossil fuel. Therefore, the types of applications using the secondary battery are currently much diversified due to the advantages of the secondary battery, and it is expected that the secondary battery will be applied to many fields and products in the future. Among such secondary batteries, lithium secondary batteries having a high energy density and working potential, a long cycle life and a low self-discharge rate are commercialized and widely used.

In order to manufacture the lithium secondary battery, an electrode assembly is prepared by stacking the positive electrode and negative electrode and the separator alternately coated with the active material, respectively, the electrode assembly is inserted into a battery case made up of cans or pouches of any size and shape, and then the electrolyte is injected to thereby manufacture the lithium secondary battery. At this time, the electrolyte injected later is permeated between the positive electrode, the negative electrode and the separator by a capillary force.

There are many pores in the electrode, separator fabric, and safety reinforced separator (SRS) coating layer. These pores become the moving path of lithium ions during the charge and discharge process. The impregnation process is a very important process for cell activation because lithium ions can be absorbed and desorbed to and from all active materials only when electrolytes are impregnated from several nm to several μm micro pores.

Meanwhile, according to the trend of increasing the capacity of electric vehicles (EVs) and energy storage systems (ESSs) lithium secondary batteries, the electrode plates of lithium secondary batteries have increased in size, while the volume to which the electrolyte can penetrate is reduced, which has increased the possibility that the electrolyte cannot be impregnated to the inside of the battery and is present only locally. In this case, since the amount of the electrolyte solution is not sufficient inside the secondary battery, the performance of the secondary battery may be degraded and the safety of the battery may be lowered. Moreover, due to the nature of the material, the positive electrode, the negative electrode, and the separator are all hydrophobic materials, whereas the electrolyte is a hydrophilic material, so that the time required for electrolyte penetration is relatively increased or the impregnation efficiency is decreased.

Such poor impregnation of the electrolyte may cause a problem of shortening the life of the battery by accelerating the deterioration of the electrode despite the good state of the other electrode.

Therefore, a method for improving the electrolyte impregnation degree and a method for evaluating the electrolyte impregnation degree in manufacturing a lithium secondary battery are essential.

As a method for analyzing the degree of impregnation of the electrode, a method of measuring the AC impedance hourly after the electrolyte injection into the cell has been widely applied, but there is a limit that it is difficult to precisely analyze.

DISCLOSURE

Technical Problem

It is an object of the present invention to solve the above-mentioned problems of the prior art and the technical problems required from the past.

Specifically, an object of the present invention is to solve the problem of the conventional measurement of the degree of electrolyte impregnation, and is to provide a measuring method for more accurately recognizing at which time point the electrolyte was sufficiently impregnated using the battery cell manufactured with the electrode used as an evaluation object.

Technical Solution

In order to achieve the above-described objects, there is provided a method for analyzing an electrolyte impregnation degree of an electrode in a battery cell, including: a battery cell manufacturing step (S1) of preparing a battery cell by injecting an electrolyte into a battery cell including an electrode to be evaluated; a step (S2) of charging/discharging the battery cell several times and obtaining a capacity-voltage profile for each cycle; a step (S3) of obtaining a differential capacity (dV/dQ) curve generated by differentiating the capacity-voltage profile for each cycle with respect to the capacity; and a step (S4) of determining a cycle, at which a behavior becomes the same, as a time point when the impregnation has been sufficiently performed in the differential capacity curve.

In the present invention, the battery cell may be one selected from the group consisting of a pouch type, a cylindrical type, a square type and a coin type.

In the present invention, the battery cell may be a half cell.

In the present invention, the battery cell may be a full cell.

In the present invention, the electrode may be a negative electrode.

In the present invention, the negative electrode may include one or two negative electrode active materials selected from the group consisting of artificial graphite and natural graphite.

In the present invention, the charge/discharge may be a C-rate condition of 0.1 C to 0.3 C.

In the present invention, the charge/discharge may be a C-rate condition of 0.15 C to 0.25 C.

In the present invention, the number of cycles may be 1 to 10.

In the present invention, the number of cycles may be 3 to 7.

Advantageous Effects

According to the electrolyte impregnation degree analysis method of the electrode in the battery cell according to the present invention, a battery cell was fabricated with an electrode to be evaluated, and the initial charge and discharge were repeated and the differential capacity curve obtained by differentiating the capacity of the charge/discharge profile at this time was analyzed to thereby making it possible to determine at which time point the electrolyte was sufficiently impregnated.

BRIEF DESCRIPTION OF THE DRAWINGS

FIG. 1 is a flowchart illustrating a method of measuring an electrolyte impregnation degree of an electrode in a battery cell according to one embodiment of the present invention;

FIG. 2 is a graph showing the result of measuring capacity according to charge and discharge cycles of a half cell according to a comparative example;

FIG. 3 is a graph showing differential capacity (dV/dQ) obtained by differentiating a charging profile by capacity for each cycle of a negative electrode coin half cell according to an example of the present invention.

FIG. 4 is a graph showing the differential capacity (dV/dQ) of three cycles of Example 1 and one cycle of the Reference Example of the present invention.

FIG. 5 is a graph showing differential capacity (dV/dQ) obtained by differentiating a charging profile by capacity for each cycle of a full cell according to Example 2 of the present invention.

DETAILED DESCRIPTION OF THE PREFERRED EMBODIMENTS

Hereinafter, the present invention will be described in detail with reference to the drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

As used herein, the terms "impregnation degree" and "degree of impregnation" refer to the degree to which an electrolyte penetrates into an electrode, particularly an electrode active material, and may be interchanged with the term "wetting".

The positive electrode material or the negative electrode material constituting the lithium secondary battery has a crystal structure, and lithium ions are repeatedly inserted and detached into and from the crystal structure according to charge/discharge, which is called intercalation/de-intercalation. Since lithium ions move between the positive electrode and the negative electrode through the electrolyte, if the electrolyte is not sufficiently impregnated with the positive electrode and the negative electrode, all of the reactable lithium ions cannot be intercalated. On the contrary, when the electrolyte is sufficiently impregnated, all of the reactable lithium ions can be intercalated.

On the other hand, the differential capacity (dV/dQ) graph that is generated by differentiating the charging profile of the lithium secondary battery against the capacity has a plurality of peaks due to the phase transition between the intercalation steps of lithium ions. It has been found that during initial charging, the behavior of the differential capacity (dV/dQ) graph changes by charging cycle, and the behavior of the differential capacity graph (dV/dQ) becomes similar over a certain number of cycles, which are because as charging and discharging are repeated, all reactable lithium ions are intercalated, and the behavior of the differential capacity graph (dV/dQ) due to intercalation converges in a certain form.

FIG. 1 is a flowchart illustrating a method of measuring an electrolyte impregnation degree of an electrode in a battery cell according to one example of the present invention. Referring to FIG. 1, the method for measuring the electrolyte impregnation degree of the electrode in the battery cell according to the present invention includes: a battery cell manufacturing step (S1) of impregnating the electrode by injecting the electrolyte to the battery cell including the electrode to be evaluated; a step (S2) of charging/discharging the battery cell several times and obtaining a capacity-voltage profile for each cycle; a step (S3) of obtaining a differential capacity (dV/dQ) curve generated by differentiating the capacity-voltage profile for each cycle with respect to the capacity; and a step (S4) of determining a cycle in which the behavior becomes the same as a time when the impregnation has been sufficiently performed in the differential capacity curve.

First, the step (S1) of manufacturing the battery cell with the electrode to be evaluated will be described. The battery cell manufacturing step (S1) of the present invention is a step of preparing a battery cell by injecting an electrolyte into a battery cell including an electrode to be measured about the degree of impregnation of the electrolyte.

The battery cell manufacturing step (S1) may further include a step of wetting the electrolyte to be impregnated in the electrode. At this time, the wetting time may be 1 hour to 24 hours.

The method of analyzing the electrolyte impregnation degree of the present invention can be applied to all kinds of secondary batteries such as a cylindrical secondary battery, a pouch type secondary battery, a square secondary battery and a coin-type secondary battery, and a full-cell containing positive electrode and negative electrode as well as a half-cell containing positive electrode or negative electrode and counter electrode.

The electrode to be evaluated in the battery cell may be a negative electrode.

For example, the negative electrode may be manufactured by coating a negative electrode mixture including a negative electrode active material, a binder, a conductive material, a solvent, and the like on a negative electrode current collector, followed by drying and rolling.

The negative electrode current collector is generally made to a thickness of 3 to 500 micrometers. The negative electrode current collector is not particularly limited as long as it has high electrical conductivity without causing chemical changes in the battery, and examples thereof include copper, stainless steel, aluminum, nickel, titanium, sintered carbon, copper or stainless steel of which the surface has been treated with carbon, nickel, titanium, silver or the like, aluminum-cadmium alloy, or the like. Further, fine unevenness may be formed on the surface to enhance the binding force of the negative electrode active material, and it may be used in various forms such as a film, a sheet, a foil, a net, a porous body, a foam, and a nonwoven fabric.

Examples of the negative electrode active material include natural graphite, artificial graphite, carbonaceous material; metals (Me) that are lithium-containing titanium composite oxide (LTO), Si, Sn, Li, Zn, Mg, Cd, Ce, Ni, or Fe; alloys composed of the metals (Me); oxides of the above metals; and one or two or more negative electrode active materials selected from the group consisting of metals and composites with carbon.

The binder is a component that assists the bonding between the conductive material, the active material and the current collector, and is typically added in an amount of 1 to 30 wt % based on the total weight of the negative electrode mixture. Examples of such binders include polyvinylidene fluoride (PVDF), polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene polymer (EPDM), sulfonated EPDM, styrene butadiene rubber, fluorine rubber, various copolymers thereof and the like.

The conductive material is a component for further improving the conductivity of the negative electrode active material, and may be added in an amount of 1 to 20 wt % based on the total weight of the negative electrode mixture. Such a conductive material is not particularly limited as long as it has electrical conductivity without causing a chemical change in the battery, and examples thereof include graphite such as natural graphite and artificial graphite; carbon black such as acetylene black, Ketjen black, channel black, furnace black, lamp black, and thermal black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The solvent may include an organic solvent such as water or NMP (N-methyl-2-pyrrolidone), and may be used in an amount that becomes a desirable viscosity when the negative electrode active material and optionally a binder and a conductive material are included. For example, the concentration of the negative electrode active material and, optionally, the solids including the binder and the conductive material may be included in an amount of 50 wt % to 95 wt %, preferably 70 wt % to 90 wt %.

The battery cell may be a full cell including both a positive electrode and a negative electrode.

The positive electrode may be manufactured by coating a positive electrode mixture including a positive electrode active material, a binder, a conductive material, and a solvent on a positive electrode current collector, followed by drying and rolling.

Representative examples of the positive electrode active material may include a single substance or a mixture of two or more selected from the group consisting of $LiCoO_2$, $LiNiO_2$, $LiMnO_2$, $LiMn_2O_4$, $Li(Ni_aCo_bMn_c)O_2$ (Herein, $0<a<1$, $0<b<1$, $0<c<1$, $a+b+c=1$), $LiNi_{1-Y}Co_YO_2$, $LiCo_{1-Y}Mn_YO_2$, $LiNi_{1-Y}Mn_YO_2$ (Herein, $0<Y<1$), $Li(Ni_aCo_bMn_c)O_4$ ($0<a<2$, $0<b<2$, $0<c<2$, $a+b+c=2$), $LiMn_{2-z}Ni_zO_4$, and $LiMn_{2-z}Co_zO_4$ (Herein, $0<Z<2$).

The positive electrode active material may be included in 80% by weight to 99% by weight based on the total weight of each positive electrode mixture.

The conductive material is usually added in an amount of 1 to 30% by weight based on the total weight of the positive electrode mixture.

Such a conductive material is not particularly limited as long as it has electrical conductivity without causing a chemical change in the battery, and examples thereof include graphite; a carbonaceous material such as carbon black, acetylene black, Ketjen black, channel black, furnace black, lamp black, and thermal black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like. Specific examples of commercially available conductive materials include products of Chevron Chemical Company, Denka Singapore Private Limited, Gulf Oil Company products, Ketjenblack, EC series (Armak Company), Vulcan XC-72 (Cabot Company) and Super P (Timcal).

The binder is added in an amount of 1 to 30% by weight, on the basis of the total weight of the positive electrode mixture, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene-butadiene rubber, fluorine rubber, various copolymers and the like.

The solvent may include an organic solvent such as NMP (N-methyl-2-pyrrolidone), and may be used in an amount that becomes a desirable viscosity when the positive electrode active material and optionally a binder and a conductive material are included. For example, the concentration of the positive electrode active material and, optionally, the solids including the binder and the conductive material may be included in an amount of 50 wt % to 95 wt %, preferably 70 wt % to 90 wt %.

On the other hand, impregnation or wetting of electrolyte solution in a secondary battery means that a non-aqueous electrolyte solution penetrates between a positive electrode, a negative electrode, and a separator by capillary force. Specifically, the electrolyte penetrates into the electrode active material on the electrode surface.

However, the positive electrode, the negative electrode (particularly the positive electrode, the negative electrode active material) and the separator are all hydrophobic (hydrophobicity) material, while in many cases, the impregnation of the electrolyte does not occur quickly (so-called impregnation delay or poor impregnation). In particular, when the impregnation of the electrolyte is degraded due to the impregnation delay, the electrolyte does not reach the active material particles of the electrode, the lithium ions are not moved smoothly, and the exhibition of performance of the normal secondary battery is delayed.

The electrolyte used to manufacture the battery cell of the present invention is commonly used in the production of a lithium secondary battery, and includes a non-aqueous organic solvent and a lithium salt.

The non-aqueous organic solvent is not particularly limited as long as it can minimize decomposition by an oxidation reaction or the like during charging and discharging of a battery and can exhibit desired properties with additives. As typical examples thereof, a carbonate compound or a propionate compound may be used alone, or two or more thereof may be mixed and used.

Examples of such carbonate compounds include any one selected from the group consisting of dimethyl carbonate (DMC), diethyl carbonate (DEC), dipropyl carbonate (DPC), methylpropyl carbonate (MPC), ethylpropyl carbonate (EPC), methylethyl carbonate (MEC), ethylene carbonate (EC), propylene carbonate (PC), butylene carbonate (BC) and vinylene carbonate (VC), or a mixture of two or more thereof.

In addition, a typical example of the propionate-based compound includes any one selected from the group consisting of ethyl propionate (EP), propyl propionate (PP), n-propyl propionate, iso-propyl propionate, n-butyl propionate, iso-butyl propionate and tert-butyl propionate, or a mixture of two or more thereof.

In addition, examples of the non-aqueous organic solvent may include N-methyl-2-pyrrolidone, propylene carbonate, ethylene carbonate, butylene carbonate, dimethyl carbonate, diethyl carbonate, gamma-butyrolactone, 1,2-dimethoxy ethane, 2-methyl tetrahydrofuran, dimethyl sulfoxide, 1,3-dioxolane, formamide, dimethylformamide, dioxolane, acetonitrile, nitromethane, methyl formate, methyl acetate, phosphate triester, trimethoxy methane, dioxolane derivatives, sulfolane, methyl sulfolane, 1,3-dimethyl-2-imidazolidinone, propylene carbonate derivatives, tetrahydrofuran derivatives, ethers, methyl propionate, and ethyl propionate.

The lithium salt is a substance that is soluble in the non-aqueous electrolyte. The examples of the lithium salt include LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, lithium 4-phenylborate, imide and the like.

In addition, the electrolyte may include vinylene carbonate (VC), propane sulfone (PS), Fluoro-Ethylene Carbonate (FEC), NA, AsA3, etc. for the purpose of improving the charge and discharge characteristics, flame retardancy, etc.

After fabricating the battery cell (S1), the battery cell is charged/discharged several times, and a step (S2) of obtaining a capacity-voltage profile for each charge/discharge cycle is performed. The step of obtaining the capacity-voltage profile is a step of obtaining a voltage profile according to the capacity by measuring the capacity and voltage of the battery cell while flowing a charge/discharge current to the battery cell.

In this case, the charge/discharge is performed at a rate of C-rate of 0.1 C to 0.3 C, preferably 0.15 C to 0.25 C, more preferably 0.18 C to 0.22 C. Here, if "C" is the secondary battery capacity of the charging unit Ah, the current in amperes is selected as the fraction (or multiplier) of C. For example, 1 C means the charge/discharge rate of drawing or filling the capacity of a fully charged secondary battery within 1 hour, and also means the current density at that time.

When the charge and discharge rate of the present invention is less than 0.1 C, it is not desirable because excessive time is required for charging and discharging, and when it exceeds 0.3 C, it is not desirable because it can adversely affect the formation of electrolyte interphase such as non-uniform thickness and discontinuity of the layer in the negative electrode.

The number of charge/discharge cycles may be 1 to 9, preferably 3 to 7, more preferably 4 to 6.

In the voltage profile according to the capacity, the x-axis denotes the capacity and the y-axis denotes the voltage. The capacity-voltage profile for each cycle can be derived by measuring the voltage according to the charge/discharge capacity in each cycle while performing the charge/discharge of the battery cell including the electrode to be evaluated several times.

After obtaining the capacity-voltage profile for each charge/discharge cycle (S2), a step (S3) of obtaining a differential capacity (dV/dQ) curve obtained by differentiating the capacity-voltage profile with respect to the capacity is performed. In the step of obtaining the differential capacity curve (S3), the charge profile (x-axis: capacity, y-axis: voltage) of each cycle is differentiated with respect to the capacity, and each cycle charging profile and the capacity of the battery cell may be applied to the following general formula to thereby calculate the differential capacity.

$$dV/dQ=(V_t-V_{t-1})/(Q_t-Q_{t-1})$$ [Formula 1]

$V_t$: charge/discharge profile of the battery cell at time t $V_{t-1}$: Charge/discharge profile of the battery cell 1 unit time before time t $Q_t$: capacity of the battery cell at time t $Q_{t-1}$: capacity of the battery cell 1 unit time before the time t In the step S4 of determining the cycle, in which the behavior becomes the same, as the time point when the impregnation is sufficient, from the differential capacity curve, the behavior observed in the differential capacity graph curve is observed to determine the impregnation degree of the electrolyte.

The operating principle of the lithium ion battery is that during discharge, lithium is oxidized to lithium ions at the negative electrode and then moves to the positive electrode through the electrolyte, and the generated electrons move to the positive electrode through the external conductor. In the positive electrode, lithium ions moved from the negative electrode are inserted to accept electrons and cause a reduction reaction. On the contrary, during charging, the oxidation reaction occurs at the positive electrode and the reduction reaction occurs at the negative electrode. The phenomenon in which lithium ions are inserted into the crystal structure of positive electrode material or negative electrode material is called intercalation.

The peak of the differential capacity graph is due to the intercalation step of the electrode. In other words, the peak represents the phase transition between different intercalation steps according to Gibb's phase rule.

The intercalation is closely related to the impregnation degree of the electrodes in the electric cell. If the degree of impregnation of the electrolyte of the electrode is not sufficient, lithium ions contained in the electrolyte are not sufficiently intercalated with the electrode, and thus the charge capacity and the discharge capacity are not properly expressed.

In addition, when the degree of impregnation of the electrolyte of the electrode reaches a sufficient level, lithium ions of the electrolyte may be sufficiently intercalated during the charging or discharging period in the electrode to thereby sufficiently express the charge capacity and the discharge capacity of the battery cell. When the charge capacity and the discharge capacity sufficiently expressed as described above are represented by the differential capacity graph curve, the same behavior showing the same peak is shown.

Further, in the step (S4) of determining a cycle, in which the behavior becomes the same, as the time point when the impregnation is sufficient, from the differential capacity curve, it can be determined, by observing the peak point on the differential capacity curve graph, that the impregnation of the electrode in the electric cell has reached a sufficient level in a cycle in which the behavior of the peak becomes the same. That is, by measuring the peak value of the differential capacity graph for each cycle, it is possible to determine the first cycle, in which the same peak value is repeated, as a time point when the impregnation has been sufficiently performed.

That is, the behavior of the differential capacity graph (dV/dQ) for each cycle changes during initial charging, and the behavior of the differential capacity graph (dV/dQ) becomes similar for a certain number of cycles, which is because all of the lithium ions that can react with charge and discharge are intercalated, and the behavior of the differential capacity graph (dV/dQ) due to intercalation converges in a certain form.

Hereinafter, the present invention will be described in detail with reference to Examples. However, the following Examples are only for illustrating the present invention, and the present invention is not limited by the following Examples.

<Preparation Example> Manufacture of Half Cells

Manufacture of Negative Electrode

A negative electrode active material in which artificial graphite and natural graphite were mixed at a ratio of 9:1, particulate graphite as a conductive material, and polyacrylonitrile as a binder were mixed at a weight ratio of 7:2:1 to prepare 0.2 g of a mixture. A negative electrode mixture slurry was prepared by adding 3.1 g of N-methyl-2-pyrrolidone (NMP) as a solvent to the mixture.

Subsequently, the negative electrode mixture slurry was applied to a copper (Cu) thin film, which is a negative electrode current collector with a thickness of 20 μm, and then dried. At this time, the temperature of the air circulated was 80° C. Then, a roll press was carried out and dried in a vacuum oven at 130° C. for 12 hours to prepare a negative electrode.

Manufacture of Half Cells

The negative electrode prepared as described above was cut into a circle of 1.4875 cm' to be used as a negative electrode, and a lithium (Li) metal thin film cut into a circle of 1.7671 cm' to be used as a counter electrode. A separator of porous polyethylene was interposed between the negative electrode and the counter electrode, and 0.5 wt % vinylene carbonate and 1 M LiPF$_6$ dissolved electrolyte were injected into a mixed solution of ethyl methyl carbonate (EMC) and ethylene carbonate (EC) with a volume ratio of 7:3, to thereby prepare a lithium coin half cell.

<Comparative Example> Determination of Electrolyte Impregnation Degree According to Charge/Discharge Capacity Behavior for Each Cycle After storing the half cell of the manufacturing example at room temperature for 3 hours, the battery was charged under 0.1 C c-rate condition, and the charged coin half cell was discharged under 0.1 C c-rate condition in one cycle. And the cycle of charge/discharge was repeated 5 times (voltage range: 0.005 V to 1 V). In addition, the charge capacity and the discharge capacity were measured for each cycle, and the results are shown in FIG. 2.

Referring to FIG. 2, it can be observed that the charge capacity and the discharge capacity of the two to five cycles increase significantly compared to those in one cycle and converge to a specific value. This is because in the first cycle (1 cycle), the impregnation of the electrolyte in the negative electrode of the half cell is insufficient, so that neither the charge capacity nor the discharge capacity is properly expressed, but as the second cycle (2 cycles) to the fifth cycle (5 cycles) proceeds, it can be assumed that the degree of electrolyte impregnation in the negative electrode increases. Accordingly, in the method of determining the electrolyte impregnation time from the charge/discharge behavior according to the cycle according to the comparative example, it can be estimated that the electrolyte is sufficiently impregnated into the negative electrode after two cycles in which all the capacities are expressed.

<Example 1> Determination of Electrolyte Impregnation Degree According to the Behavior of the Differential Capacity Curve for Each Cycle After storing the half cell of the manufacturing example at room temperature for 3 hours, the battery was charged under 0.1 C c-rate condition, and the charged coin half cell was discharged under 0.1 C c-rate condition in one cycle. And the cycle of charge/discharge was repeated 5 times (voltage range: 0.005 V to 1 V).

For each cycle, the charge profile (x-axis: capacity, y-axis: voltage) was applied to the following general formula 1 to calculate the differential capacity (dV/dQ) curve for the capacity. And the result is shown in FIG. 3.

$$dV/dQ=(V_t-V_{t-1})/(Q_t-Q_{t-1})$$ [Formula 1]

$V_t$: charge/discharge profile of the battery cell at time t $V_{t-1}$: Charge/discharge profile of the battery cell 1 unit time before time t $Q_t$: capacity of the battery cell at time t $Q_{t-1}$: capacity of the battery cell 1 unit time before the time t FIG. 3 is a graph showing the differential capacity obtained by differentiating the charging profile (x-axis: capacity, y-axis: voltage) of each cycle with respect to the capacity. Referring to FIG. 3, one cycle and two cycles differ in the position of the peak and the behavior of the graph. The same is true for two and three cycles. However, after three cycles, the graph's behavior is almost the same, so that the three differential capacity curves coincide, which means that after three cycles, all of the reactable lithium ions are intercalated within the negative electrode, leading to the situation that the behavior of the graph of the differential capacity due to intercalation becomes the same after 3 cycles. Accordingly, the time point when the electrolyte is sufficiently impregnated in the negative electrode of the half cell may be determined as the time after 3 cycles.

The following experiment was further conducted to confirm whether the determination method of the electrolyte impregnation time point is true from the differential capacity curve behavior according to Example 1.

<Reference Example> Differential Capacity Curve of Half Cell Stored for 3 Days after Electrolyte Injection The half cell was assembled in the same manner as in Preparation Example, and the electrolyte was injected and stored at room temperature for 3 days so that the electrolyte was sufficiently impregnated into the electrode. Thereafter, charging/discharging was repeated five times with respect to the half cell in which the electrolyte solution was sufficiently impregnated under the same conditions as in Example 1. Then, as in Example 1, the charge profile (x-axis: capacity, y-axis: voltage) for each cycle was differentiated with respect to the capacity to calculate the differential capacity (dV/dQ) curve.

The differential capacity curves of three cycles determined to be sufficiently impregnated time points in Example 1 and the differential capacity curve of one cycle in the reference example are shown in FIG. 4, respectively. Referring to FIG. 4, it can be seen that these two differential capacity curves overlap each other. In the reference example, since the half cell in which the electrolyte was sufficiently impregnated was charged/discharged, the differential capacity curve of one cycle of the half cell of the reference example may be regarded as the differential capacity curve of the negative electrode sufficiently impregnated with the electrolyte. Therefore, the point that the three cycles of the differential capacity curve in Example 1 coincides with the one cycle of the differential capacity curve in Reference Example may mean that the result according to the determination method of the electrolyte solution impregnation time point of Example 1 is consistent with the fact.

Therefore, through such an experiment, when using the analysis method according to an embodiment of the present invention, there is an effect that the time point of impregnation of the electrolyte can be more accurately grasped. That is, the method for analyzing the degree of impregnation of the electrolyte solution of the present invention may be evaluated as providing a reliable result in determining at what time point the electrolyte is sufficiently impregnated.

In order to confirm whether the analysis method of the present invention is applicable to a full-cell, a full-cell was assembled as follows, and a differential capacity curve for each cycle according to charge/discharge was produced.

Example 2

96% by weight of Li(Ni$_{0.8}$Co$_{0.01}$Mn$_{0.1}$)O$_2$, 2% by weight of Denka black (conductor) and 2% by weight of PVdF (Polyvinylidene fluoride, binder) were added to N-Methyl-2-pyrrolidone (NMP) to thereby prepare an electrode mixture slurry. The positive electrode mixture slurry prepared above was coated on one surface of the aluminum current collector, dried and rolled, and punched to a predetermined size to prepare a positive electrode.

A membrane of porous polyethylene was interposed between the positive electrode and the negative electrode of the preparation example, and 0.5 wt % vinylene carbonate and 1 M LiPF$_6$ dissolved electrolyte were injected into a mixed solution of ethyl methyl carbonate (EMC) and ethylene carbonate (EC) with a volume ratio of 7:3, to thereby prepare a full cell. Thereafter, the full cell was stored at room temperature for 3 hours to wet the electrolyte solution.

Thereafter, charging and discharging were performed in the same manner as in Example 1, and a differential capacity (dV/dQ) curve of the negative electrode was calculated and the results are shown in FIG. 5.

Referring to FIG. 5, similarly to the half cell, a differential capacity peak due to the graphite structure of the negative electrode is clearly seen in the full cell, too. In addition, 1 cycle and 2 cycles have different peak positions and graph behaviors, which is the same for 2 cycles and 3 cycles, but 3 cycles to 5 cycles have almost the same graph behavior. Hence, in the full cell, as in the half cell, the analysis method of the present invention may be used to determine in which cycle the electrolyte is sufficiently impregnated.

It will be understood by those skilled in the art that various changes in form and details may be made therein without departing from the spirit and scope of the invention as defined by the appended claims.

The invention claimed is:

1. A method for analyzing an electrolyte impregnation degree of an electrode in a battery cell, the method comprising:
    preparing a battery cell by injecting an electrolyte into the battery cell including an electrode to be evaluated;
    Charging and discharging the battery cell more than one time and obtaining a capacity-voltage profile for each cycle; obtaining a differential capacity (dV/dQ) curve generated by differentiating the capacity-voltage profile for each cycle with respect to the capacity; and determining a cycle, at which a behavior of the capacity-voltage profile becomes the same as a behavior of the capacity-voltage profile of an immediately preceding cycle, as a time point when the impregnation has been sufficiently performed in the differential capacity curve.

2. The method of claim 1, wherein the battery cell comprises at least one selected from the group consisting of a pouch cell, a cylindrical cell, a square cell and a coin cell.

3. The method of claim 1, wherein the battery cell comprises a half cell.

4. The method of claim 1, wherein the battery cell comprises a full cell.

5. The method of claim 1, wherein the electrode is a negative electrode.

6. The method of claim 5, wherein the negative electrode includes one or two active materials selected from the group consisting of artificial graphite and natural graphite.

7. The method of claim 1, wherein the charging and discharging is performed under a condition of C-rate of 0.1C to 0.3C.

8. The method of claim 1, wherein the charging and discharging is performed under a condition of C-rate of 0.15C to 0.25C.

9. The method of claim 1, wherein a number of cycles is 1 to 10.

10. The method of claim 1, wherein a number of cycles is 3 to 7.

* * * * *